United States Patent
Yang et al.

(10) Patent No.: US 10,438,958 B2
(45) Date of Patent: Oct. 8, 2019

(54) METHOD FOR MANUFACTURING SEMICONDUCTOR MEMORY DEVICE

(71) Applicant: Winbond Electronics Corp., Taichung (TW)

(72) Inventors: Cheng-Ta Yang, Taichung (TW); Lu-Ping Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/871,074

(22) Filed: Jan. 15, 2018

(65) Prior Publication Data

US 2018/0342527 A1 Nov. 29, 2018

(30) Foreign Application Priority Data

May 26, 2017 (CN) .......................... 2017 1 0383671

(51) Int. Cl.
*H01L 27/11* (2006.01)
*H01L 27/11521* (2017.01)
(Continued)

(52) U.S. Cl.
CPC .. *H01L 27/11521* (2013.01); *H01L 27/11524* (2013.01); *H01L 27/11529* (2013.01);
(Continued)

(58) Field of Classification Search
CPC ......... H01L 27/11521; H01L 27/11529; H01L 27/11546
See application file for complete search history.

(56) References Cited

U.S. PATENT DOCUMENTS 5,891,774 A * 4/1999 Ueda ................. H01L 27/11521
257/E21.682
6,023,085 A * 2/2000 Fang ................. H01L 27/11526
257/261
(Continued)

FOREIGN PATENT DOCUMENTS

| CN | 103208459 | 7/2013 |
|---|---|---|
| TW | 200746369 | 12/2007 |
| TW | 200907968 | 2/2009 |

OTHER PUBLICATIONS

Chun-Hsu Chen, et al., "Method for Fabricating Memory Device," Unpublished U.S. Appl. No. 15/353,717, filed Nov. 16, 2016.

*Primary Examiner* — Charles D Garber
*Assistant Examiner* — S M Sohel Imtiaz
(74) *Attorney, Agent, or Firm* — JCIPRNET

(57) ABSTRACT

A method for manufacturing a semiconductor memory device including following steps is provided. A substrate having a first region, a second region, and a third region is provided. A first stack structure is formed on the first region. A second stack structure is formed on the second region. A third stack structure is formed on the third region. A first mask layer is formed on the substrate to cover the third stack structure. A first ion implantation process is performed, so that a second floating gate and a second control gate in the second stack structure are changed to a first conductive type. A second mask layer formed on the substrate to cover the first and second stack structures. A second ion implantation process is performed, so that a third floating gate and a third control gate in the third stack structure are changed as a second conductive type.

10 Claims, 6 Drawing Sheets

(51) Int. Cl.
*H01L 27/11546* (2017.01)
*H01L 27/11529* (2017.01)
*H01L 29/49* (2006.01)
*H01L 27/11524* (2017.01)
*H01L 27/11536* (2017.01)
*H01L 27/11539* (2017.01)
*H01L 27/11541* (2017.01)
*H01L 27/11543* (2017.01)

(52) U.S. Cl.
CPC .. *H01L 27/11536* (2013.01); *H01L 27/11539* (2013.01); *H01L 27/11541* (2013.01); *H01L 27/11543* (2013.01); *H01L 27/11546* (2013.01); *H01L 29/49* (2013.01)

(56) References Cited

U.S. PATENT DOCUMENTS

| | | | |
|---|---|---|---|
| 6,159,795 A * | 12/2000 | Higashitani | H01L 27/105 257/E21.689 |
| 6,528,376 B1 * | 3/2003 | Guo | H01L 21/26586 257/E21.345 |
| 7,563,664 B2 | 7/2009 | Ichige et al. | |
| 9,349,742 B2 * | 5/2016 | Wu | H01L 27/11568 |
| 2003/0030097 A1 * | 2/2003 | Lee | H01L 21/28194 257/314 |
| 2005/0088889 A1 * | 4/2005 | Lee | H01L 27/105 365/202 |
| 2007/0133289 A1 | 6/2007 | Ma et al. | |
| 2008/0076242 A1 * | 3/2008 | Choi | H01L 27/11526 438/588 |
| 2009/0042359 A1 * | 2/2009 | Lindsay | H01L 21/26506 438/433 |
| 2011/0053338 A1 * | 3/2011 | Chiang | H01L 27/11521 438/424 |
| 2011/0215392 A1 * | 9/2011 | Kim | H01L 21/76841 257/315 |
| 2011/0303971 A1 * | 12/2011 | Lee | H01L 27/11551 257/324 |
| 2014/0073126 A1 * | 3/2014 | Shen | H01L 21/823456 438/591 |
| 2018/0122818 A1 * | 5/2018 | Tseng | H01L 29/66545 |

* cited by examiner

METHOD FOR MANUFACTURING SEMICONDUCTOR MEMORY DEVICE

CROSS-REFERENCE TO RELATED APPLICATION

This application claims the priority benefit of China application serial no. 201710383671.4, filed on May 26, 2017. The entirety of the above-mentioned patent application is hereby incorporated by reference herein and made a part of this specification.

BACKGROUND OF THE INVENTION

Field of the Invention

The invention relates to a method for manufacturing a semiconductor device, and particularly relates to a method for manufacturing a semiconductor memory device.

Description of Related Art

Along with development of technology, in order to meet the demand for reducing cost and simplifying steps of a manufacturing process of a memory device, it has become a trend to integrate elements on a cell region and a periphery region in a single chip. Based on different functions required by the memory device, transistors with different functions are respectively formed in the cell region and the periphery region.

Generally, the transistors in the periphery region are complementary metal-oxide-semiconductor (CMOS) transistors including N-type metal oxide semiconductor (NMOS) transistors and P-type metal oxide semiconductor (PMOS) transistors. However, when N-type gate electrodes and P-type gate electrodes are respectively formed on the periphery region by using a lithography process and an ion implantation process, a subsequent thermal process may cause neutralization of N-type dopant of the N-type gate electrodes and P-type dopant of the P-type gate electrodes, so that a structure and an effect of a dual work function gate cannot be achieved.

SUMMARY OF THE INVENTION

The invention is directed to a method for manufacturing a semiconductor memory device, which is adapted to combine a triple gate dielectric layer process and a dual work function gate process to improve performance of the semiconductor memory device.

The invention provides a method for manufacturing a semiconductor memory device, which includes following steps. A substrate having a first region, a second region and a third region is provided. A first stack structure is formed on the first region. The first stack structure sequentially includes a first gate dielectric layer, a first floating gate, a first inter-gate dielectric layer and a first control gate. A second stack structure is formed on the second region. The second stack structure sequentially includes a second gate dielectric layer, a second floating gate, a second inter-gate dielectric layer and a second control gate. A third stack structure is formed on the third region. The third stack structure sequentially includes a third gate dielectric layer, a third floating gate, a third inter-gate dielectric layer and a third control gate. A first mask layer is formed on the substrate to cover the third stack structure. A first ion implantation process is performed, so that conductive types of the second floating gate and the second control gate are changed to a first conductive type. The first mask layer is removed, and a second mask layer is formed on the substrate to cover the first stack structure and the second stack structure. A second ion implantation process is performed, so that conductive types of the third floating gate and the third control gate are changed to a second conductive type.

According to the above description, the invention provides a method for manufacturing a semiconductor memory device, which adopts a triple gate dielectric layer process and a dual work function gate process to integrate elements of the cell region and the periphery region on a same chip. During the period of performing the ion implantation process, since the gate structure of the cell region is separated from the gate structures of the high-voltage device region and the low-voltage device region of the periphery region, the phenomenon of neutralization of the N/P-type dopants caused by the subsequent thermal process can be avoided. In this way, the semiconductor memory device of the invention combines the triple gate dielectric layer and the dual work function gate, by which not only the performance of the semiconductor memory device is improved, but also configuration of the semiconductor memory device is more flexible, so as to cope with the demand of the designer or user.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
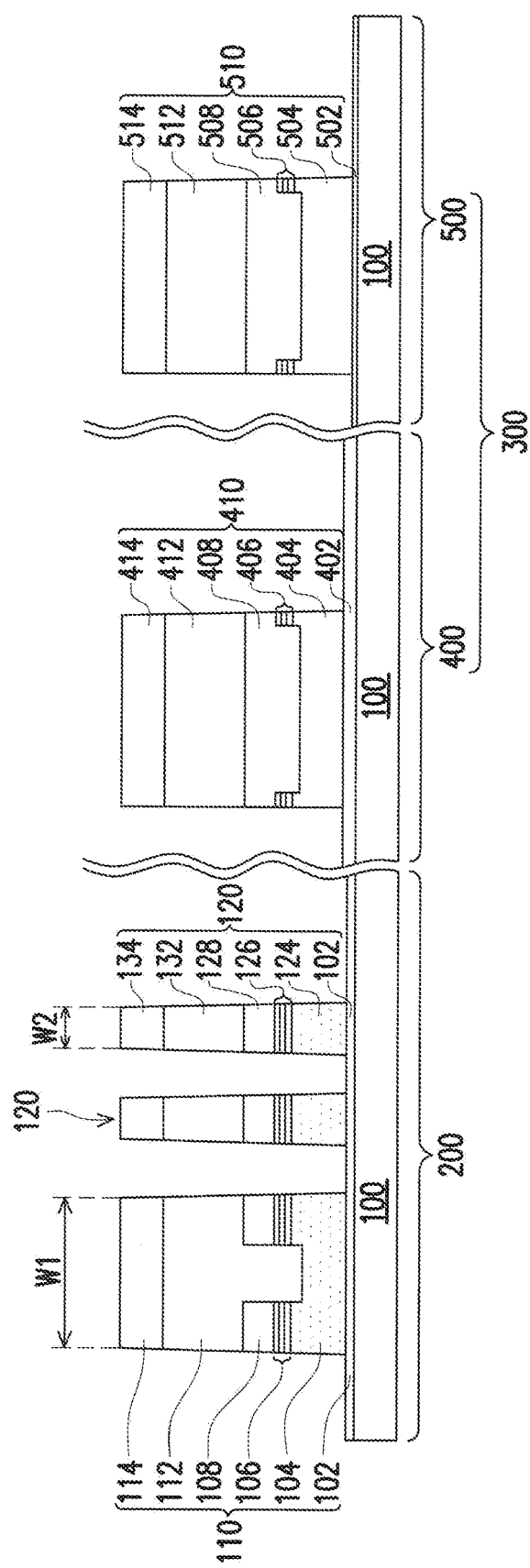
FIG. 1A to FIG. 1F are cross-sectional views of a manufacturing flow of a semiconductor memory device according to an embodiment of the invention.

Referring to the drawings of the invention for a further understanding of the invention. However, the invention can be embodied in various forms, and is not limited to the embodiments provided below. Moreover, the thickness of the layers and regions in the drawings is enlarged for clarity's sake. Wherever possible, the same reference numbers are used in the drawings and the description to refer to the same or like parts, and description thereof are not repeated.

In the following embodiments, a first conductive type and a second conductive type are different conductive types. Namely, when the first conductivity type is an N-type, the second conductivity type is a P-type; and when the first conductivity type is the P-type, the second conductivity type is the N-type. In the present embodiment, the first conductivity type is, for example, the N-type, and the second conductivity type is, for example, the P-type, though the invention is not limited thereto. The P-type dopant is, for example, boron; and the N-type dopant is, for example, phosphorus or arsenic.

FIG. 1A to FIG. 1F are cross-sectional views of a manufacturing flow of a semiconductor memory device according to an embodiment of the invention.

Referring to FIG. 1A, a substrate 100 is provided, where a material of the substrate 100 is, for example, at least one material selected from a group consisting of Si, Ge, SiGe, GaP, GaAs, SiC, SiGeC, InAs and InP. In an embodiment, the substrate 100 can also be a silicon on insulator (SOI) substrate. The substrate 100 has a cell region 200 (which can be regarded as a first region) and a periphery region 300. In detail, the periphery region 300 includes a high-voltage device region 400 (which can be regarded as a second region) and a low-voltage device region 500 (which can be regarded as a third region). In an alternative embodiment, the periphery region 300 may also include a low-voltage device region (which can be regarded as the second region) and an ultra-low-voltage device region (which can be regarded as the third region).

Then, a first stack structure 110 is formed on the cell region 200, a second stack structure 410 is formed on the high-voltage device region 400, and a third stack structure 510 is formed on the low-voltage device region 500. In the present embodiment, the first stack structure 110, the second stack structure 410 and the third stack structure 510 are separated from each other and not connected to each other. Moreover, a forming sequence of the first stack structure 110, the second stack structure 410 and the third stack structure 510 is not limited by the invention, and it is considered to be within the protection scope of the invention as long as the first stack structure 110, the second stack structure 410 and the third stack structure 510 separated from each other are formed on the substrate 110.

In detail, the first stack structure 110 sequentially includes a first gate dielectric layer 102, a first floating gate 104, a first inter-gate dielectric layer 106, first control gates 108, 112 and a first cap layer 114 from bottom to top. In an embodiment, the first stack structure 110 is, for example, a select gate.

The first gate dielectric layer 102 is, for example, a tunneling dielectric layer. In an embodiment, a material of the first gate dielectric layer 102 includes silicon oxide, silicon oxynitride, silicon nitride or other suitable dielectric material, and a method of forming the first gate dielectric layer 102 includes a chemical vapor deposition method or a furnace tube oxidation method, and a thickness of the first gate dielectric layer 102 can be 1 nm to 20 nm, which is preferably 6 nm to 9 nm.

In an embodiment, a material of the first floating gate 104 is, for example, N-type doped polysilicon, and a method for forming the first floating gate 104 includes the chemical vapor deposition method, and a thickness of the first floating gate 104, for example, 50 nm to 100 nm, though the invention is not limited thereto, and in other embodiments, the first floating gate 104 may have an N-type conductive type (shown in FIG. 1D) based on a subsequent first ion implantation process 210.

The first inter-gate dielectric layer 106 may be a stack structure constructed by a single-layer material layer or a multi-layer material layer. For example, the first inter-gate dielectric layer 106 is, for example, a stack layer of silicon oxide/silicon nitride/silicon oxide (ONO) or a stack layer of silicon nitride/silicon oxide/silicon nitride/silicon oxide/silicon nitride (NONON), and a method of forming the first inter-gate dielectric layer 106 includes the chemical vapor deposition method, and a thickness of the first inter-gate dielectric layer 106 is, for example, 5 nm to 30 nm, which is preferably 10 nm to 15 nm. In an exemplary embodiment, the thickness of the first inter-gate dielectric layer 106 is greater than the thickness of the first gate dielectric layer 102.

A material of the first control gates 108, 112 includes undoped polysilicon or intrinsic polysilicon, and a method for forming the first control gates 108, 112 includes the chemical vapor deposition method. To be specific, the first control gate 112 is located on the first control gate 108, and the first control gate 112 has a protrusion structure. The protrusion structure extends downwards from a bottom surface of the first control gate 112 and penetrates through the first control gate 108 and the first inter-gate dielectric layer 106 to contact the first floating gate 104.

A material of the first cap layer 114 includes silicon oxide, silicon nitride or other suitable dielectric material, and a method for forming the first cap layer 114 includes the chemical vapor deposition method, where a thickness of the first cap layer 114 can be 10 nm to 100 nm, which is preferably 40 nm to 100 nm. In an exemplary embodiment, the thickness of the first cap layer 114 is greater than the thickness of the first inter-gate dielectric layer 106.

Moreover, besides the first stack structure 110, the cell region 200 further includes a plurality of word lines 120. Each of the word lines 120 sequentially includes the first gate dielectric layer 102, a fourth floating gate 124, a fourth inter-gate dielectric layer 126, fourth control gates 128, 132 and a fourth cap layer 134 from bottom to top. Since the word line 120 is similar to the first stack structure 110, and the components and the forming method of the first stack structure 110 have been described in the aforementioned paragraph, details thereof are not repeated. In an embodiment, a width W1 of the first stack structure 110 (for example, a select gate) can be 100 nm to 300 nm, which is preferably 140 nm to 220 nm, and a width W2 of the word line 120 can be 5 nm to 80 nm, which is preferably 10 nm to 58 nm.

Moreover, the second stack structure 410 sequentially includes a second gate dielectric layer 402, a second floating gate 404, a second inter-gate dielectric layer 406, second control gates 408, 412 and a second cap layer 414 from bottom to top. In an embodiment, the second stack structure 410 is, for example, a high-voltage MOS.

Since the second stack structure 410 is similar to the first stack structure 110, and the components and the forming method of the first stack structure 110 have been described in the aforementioned paragraph, details thereof are not repeated. A difference between the second stack structure 410 and the first stack structure 110 is that a thickness of the second gate dielectric layer 402 of the second stack structure 410 is greater than the thickness of the first gate dielectric layer 102, and the thickness of the second gate dielectric layer 402 can be 30 nm to 50 nm. Moreover, the second floating gate 404 and the second control gates 408, 412 of the second stack structure 410 may become polysilicon with the N-type conductive type through the subsequent first ion implantation process 210 (as shown in FIG. 1D).

Moreover, the third stack structure 510 sequentially includes a third gate dielectric layer 502, a third floating gate 504, a third inter-gate dielectric layer 506, third control gates 508, 512 and a third cap layer 514 from bottom to top. In an embodiment, the third stack structure 510 is, for example, a low-voltage MOS.

Since the third stack structure 510 is similar to the first stack structure 110, and the components and the forming method of the first stack structure 110 have been described in the aforementioned paragraph, details thereof are not repeated. A difference between the third stack structure 510 and the first stack structure 110 is that a thickness of the third gate dielectric layer 502 of the third stack structure 510 is smaller than the thickness of the first gate dielectric layer 102, and the thickness of the third gate dielectric layer 502 can be 2 nm to 4 nm. Moreover, the third floating gate 504 and the third control gates 508, 512 of the third stack structure 510 may become polysilicon with the P-type conductive type through the subsequent second ion implantation process 214 (as shown in FIG. 1E).

The method for manufacturing the semiconductor memory device of the present embodiment may adopt a triple gate dielectric layer process to form the gate dielectric layers of different thicknesses on the substrate 100, so as to improve the performance of the semiconductor memory device.

Figure 1B:
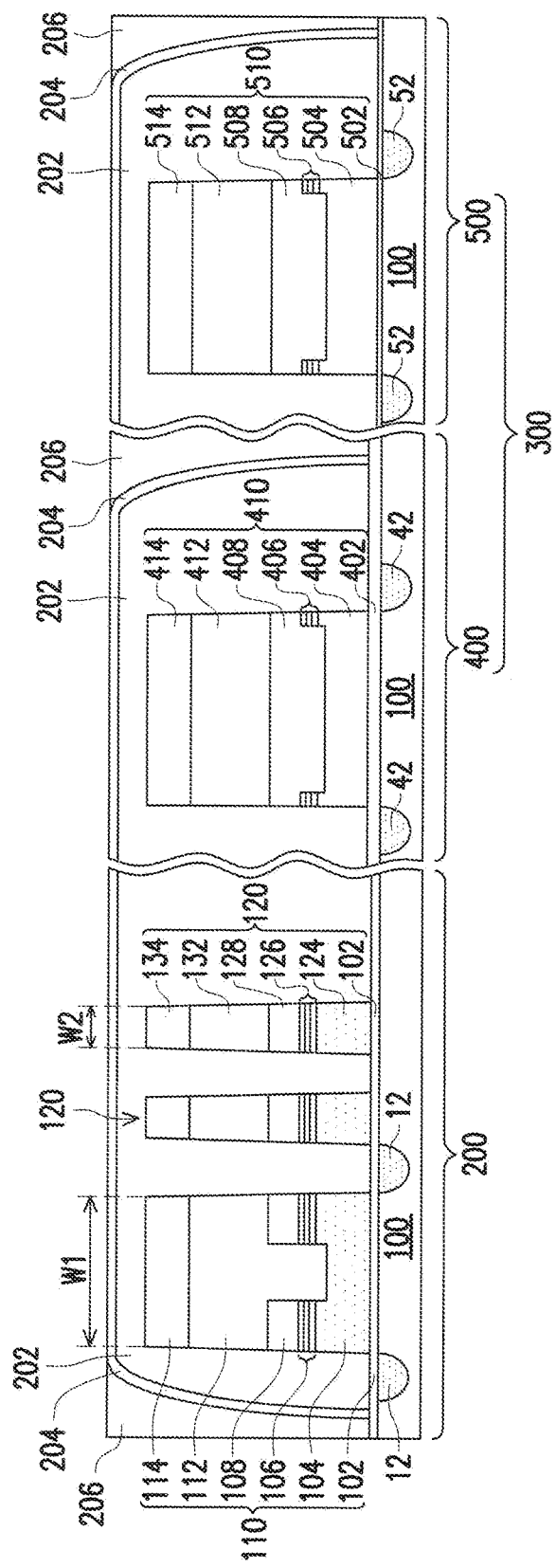
Figure 1C:
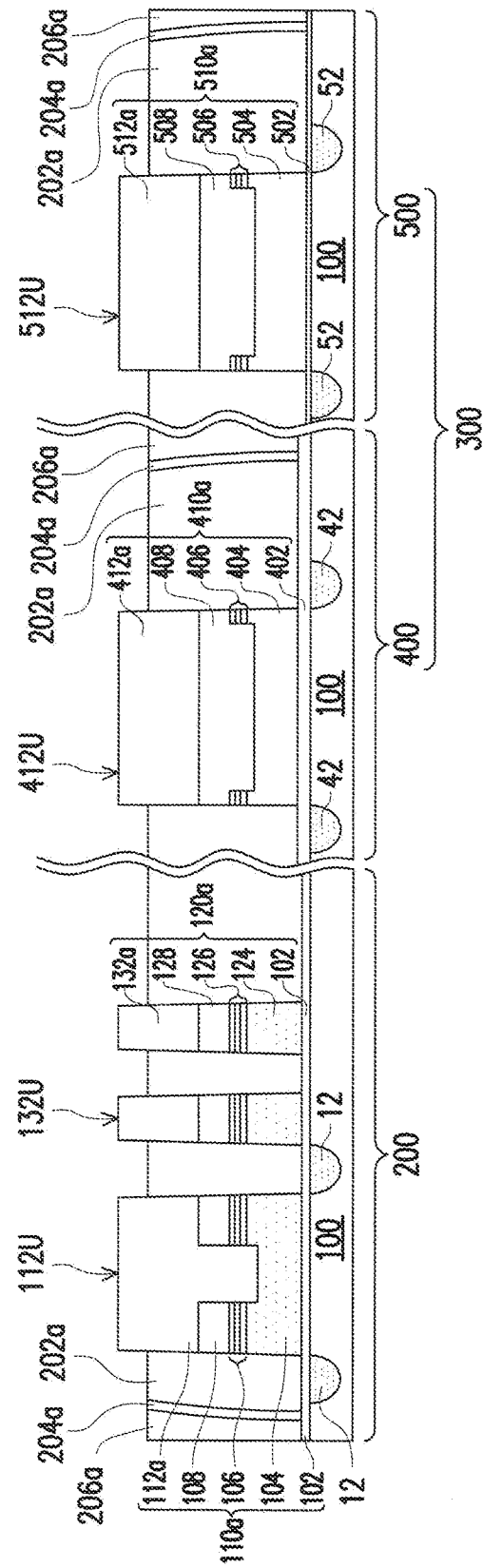
Figure 1D:
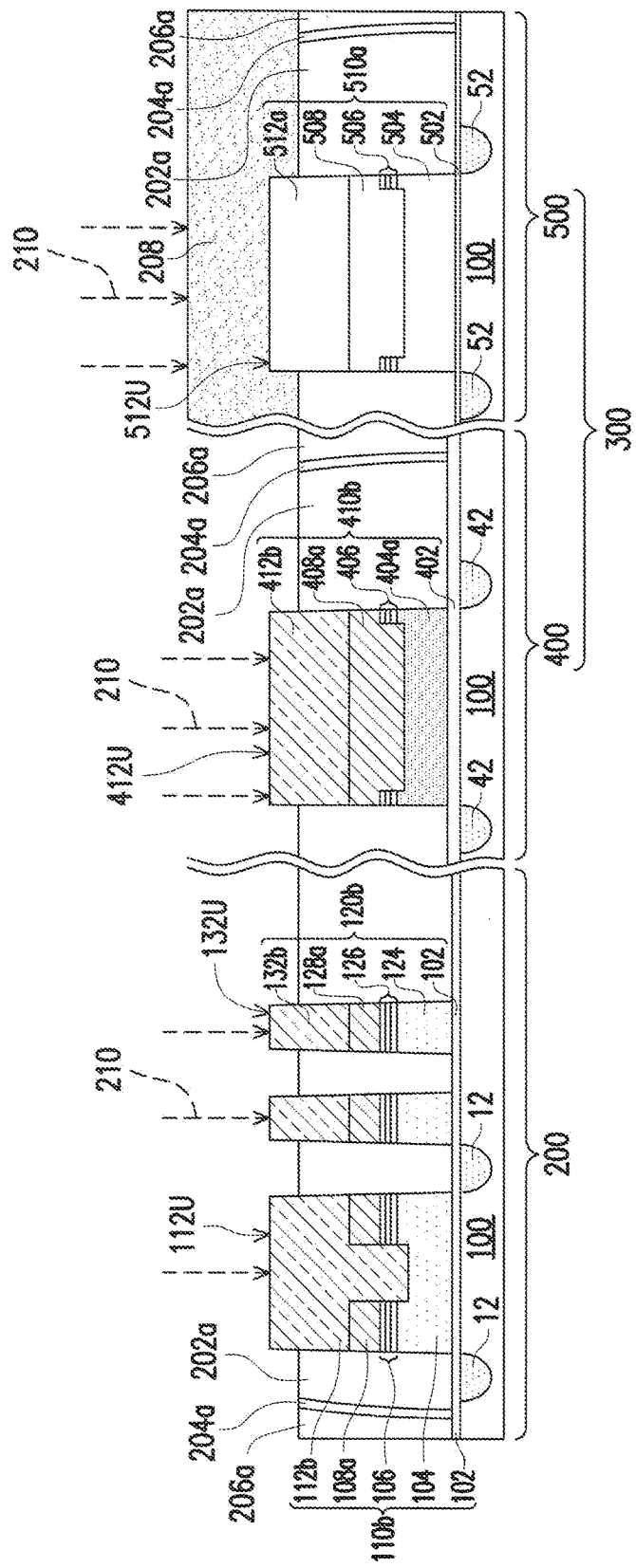
Figure 1E:
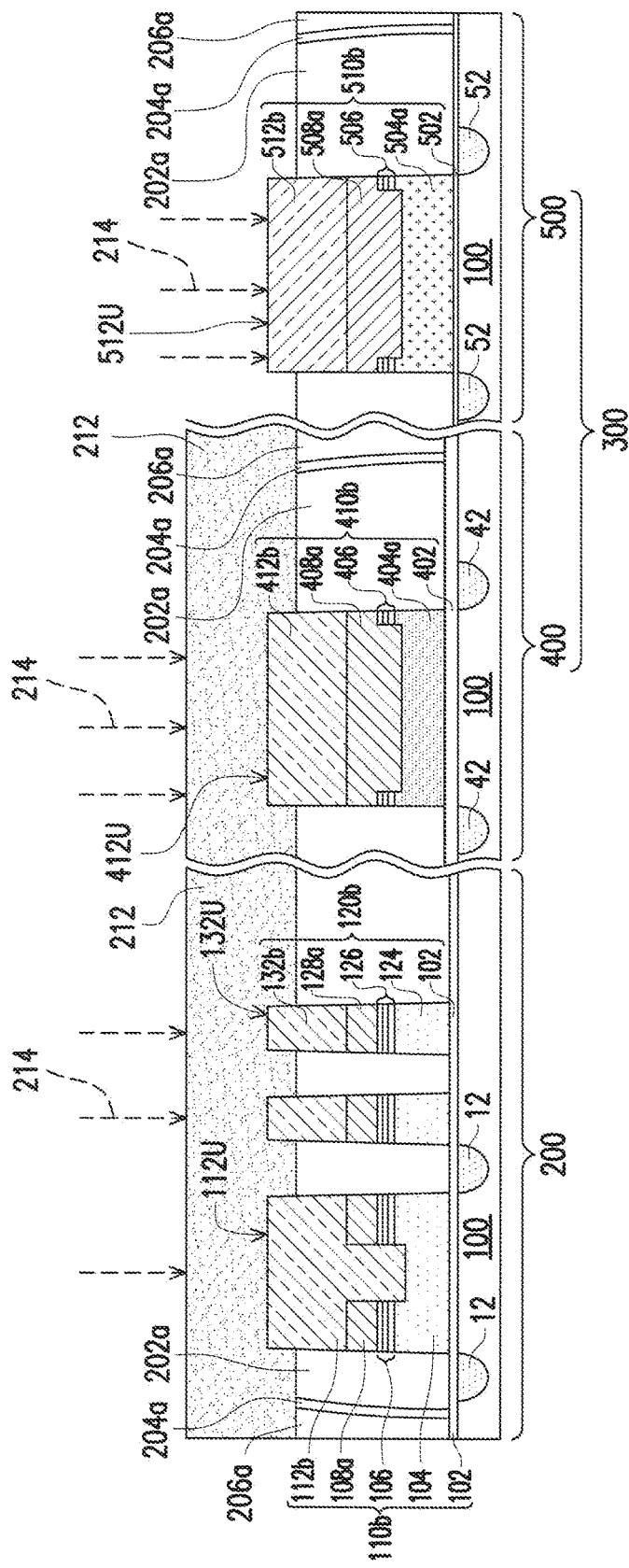

Referring to FIG. 1A and FIG. 1B, before dielectric layers 202, 204, 206 are formed (or before the first ion implantation process 210 of FIG. 1D is performed), a first source/drain 12 is formed in the substrate 100 at two sides of the first stack structure 110; a second source/drain 42 is formed in the substrate 100 at two sides of the second stack structure 410; and a third source/drain 52 is formed in the substrate 100 at two sides of the third stack structure 510. The first source/drain 12, the second source/drain 42 and the third source/drain 52 can be formed by forming a mask pattern and performing a source/drain ion implantation process. For example, a mask pattern (not shown) can be formed on the substrate 100 at the high-voltage device region 400 and the low-voltage device region 500, and the source/drain ion implantation process is performed by taking the first cap layer 114 and the mask pattern as a mask, so as to form the first source/drain 12 in the substrate 100 at two sides of the first stack structure 110. Deduced by analogy, the second source/drain 42 and the third source/drain 52 are formed by using the similar method. In an embodiment, a dopant implanted to the first source/drain 12 is, for example, phosphorus or arsenic, and a doping concentration thereof is, for example, $1 \times 10^{12}/cm^3$ to $1 \times 10^{15}/cm^3$. A dopant implanted to the second source/drain 42 is, for example, phosphorus or arsenic, and a doping concentration thereof is, for example, $1 \times 10^{14}/cm^3$ to $3 \times 10^{16}/cm^3$. A dopant implanted to the third source/drain 52 is, for example, boron, and a doping concentration thereof is, for example, $1 \times 10^{14}/cm^3$ to $2.5 \times 10^{16}/cm^3$.

Then, the dielectric layer 202 is formed on the substrate 100. To be specific, the dielectric layer 202 covers surfaces of the first stack structure 110, the word line 120, the second stack structure 410 and the third stack structure 510. The dielectric layer 202 is also filled in a space between the first stack structure 110 and the word line 120 and a space between two adjacent word lines 120. A material of the dielectric layer 202 includes a dielectric material with better trench filling capability.

Then, the dielectric layers 204, 206 are sequentially formed on the dielectric layer 202. A material of the dielectric layer 204 includes silicon nitride; a material of the dielectric layer includes silicon oxide, which can be a flowable material, for example, spin-on glass (SOG), flowable silicon oxide etc. As shown in FIG. 1B, after a planarization process (for example, a chemical-mechanical planarization (CMP) process), top surfaces of the dielectric layers 204, 206 on the cell region 200, the high-voltage device region 400 and the low-voltage device region 500 are coplanar.

Referring to FIG. 1B and FIG. 1C, an etching back process is performed to remove a part of the dielectric layers 202, 204, 206, the first cap layer 114, the fourth cap layer 134, the second cap layer 414, the third cap layer 514, a part of the first control gate 112, a part of the fourth control gate 132, a part of the second control gate 412 and a part of the third control gate 512, so as to expose an upper surface 112U of the first control gate 112a, an upper surface 132U of the fourth control gate 132a, an upper surface 412U of the second control gate 412a and an upper surface 512U of the third control gate 512a. In an alternative embodiment, a part of sidewalls of the first control gate 112a, the fourth control gate 132a, the second control gate 412a and the third control gate 512a is exposed by the electric layer 202a, 204a, 206a.

Referring to FIG. 1C and FIG. 1D, a first mask layer 208 is formed on the substrate 100. The first mask layer 208 covers the third stack structure 510a of the low-voltage device region 500. In an embodiment, a material of the first mask layer 208 is, for example, a carbon or photoresist material. Then, the first ion implantation process 210 is performed, so that the undoped polysilicon or intrinsic polysilicon of the first control gates 108, 112a, the fourth control gates 128, 132a, the second floating gate 404 and the second control gates 408, 412a become an N-type conductive type. In an embodiment, the dopant implanted by the first ion implantation process 210 is, for example, phosphorus or arsenic, and a doping concentration of the dopant is, for example, $1 \times 10^{14}/cm^3$ to $5 \times 10^{16}/cm^3$.

Referring to FIG. 1D and FIG. 1E, the first mask layer 208 is removed, and a second mask layer 212 is formed on the substrate 100. In an embodiment, a material of the second mask layer 212 is, for example, a carbon or photoresist material. The second mask layer 212 covers the first stack structure 110b and the word line 120b of the cell region 200 and the second stack structure 410b of the high-voltage device region 400. Then, a second ion implantation process 214 is performed, such that the undoped polysilicon or intrinsic polysilicon of the third floating gate 504 and the third control gates 508, 512a become a P-type conductive type. In an embodiment, the dopant implanted by the second ion implantation process 214 is, for example, boron, and a doping concentration of the dopant is, for example, $1 \times 10^{14}/cm^3$ to $6 \times 10^{16}/cm^3$.

It should be noted that regarding the semiconductor memory device of the present embodiment, by sequentially performing the source/drain ion implantation process, the first ion implantation process 210 and the second ion implantation process 214, doping concentrations and configurations of the first source/drain 12, the second source/drain 42, the third source/drain 52, the N-type first stack structure 110b, the N-type word line 120b, the N-type second stack structure 410b and the P-type third stack structure 510b can be more flexible, so as to cope with the demand of the designer or user. Moreover, since the first stack structure 110b of the cell region 200, the second stack structure 410b of the high-voltage device region 400 and the third stack structure 510b of the low-voltage device region 500 are separated from each other, the phenomenon of neutralization of the N/P-type dopants caused by the subsequent thermal process can be avoided.

Figure 1F:
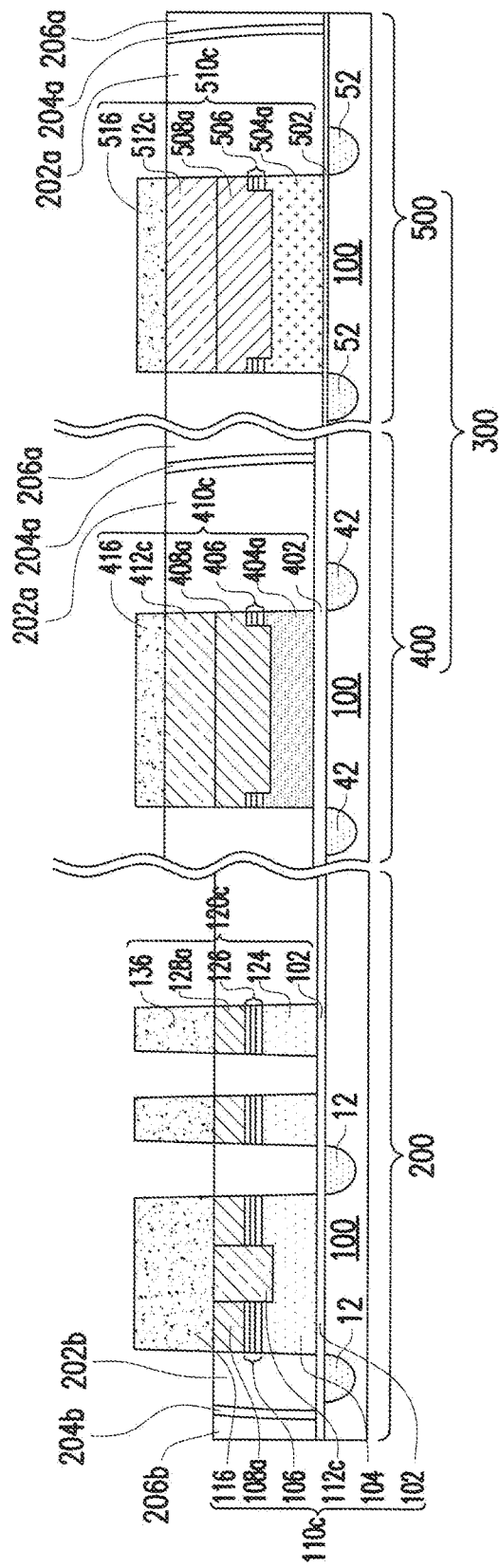

Referring to FIG. 1E and FIG. 1F, after the second ion implantation process 214 is performed, the second mask layer 212 is removed. Then, a metal layer (not shown) is formed on the substrate 100 to contact the first control gate 112b, the fourth control gate 132b, the second control gate 412b and the third control gate 512b that are not covered by the dielectric layers 202a, 204a, 206a. The metal layer includes, for example, a metal material such as Ni, Co, Ti, W, Mo, Pt or Pd, etc.

Then, a metal silicification process is performed, such that the metal layer is reacted with the first control gate 112b, the fourth control gate 132b, the second control gate 412b and the third control gate 512b in contact with the metal layer to form a first metal silicide layer 116, a fourth metal silicide layer 136, a second metal silicide layer 416, and a third metal silicide layer 516. In an embodiment, the metal silicification process is, for example, an anneal process. The first metal silicide layer 116, the fourth metal silicide layer 136, the second metal silicide layer 416, and the third metal silicide layer 516 may include NiSi, CoSi, TiSi, WSi, MoSi, PtSi or PdSi, or other metal silicide.

It should be noted that as shown in FIG. 1F, a thickness of the first metal silicide layer 116 of the first stack structure 110 and a thickness of the fourth metal silicide layer 136 of the word line 120c can be greater than a thickness of the second metal silicide layer 416 of the second stack structure 410c and a thickness of the third metal silicide layer 516 of the third stack structure 510c. A method for forming the first metal silicide layer 116 and the fourth metal silicide layer 136 is, for example, to move a part of the dielectric layers 202a, 204a, 206a of the cell region 200 before the metal layer is formed, such that areas of the first control gate 112b, the fourth control gate 132b exposed by the dielectric layers 202b, 204b, 206b are increased. In an embodiment, the step of removing a part of the dielectric layer 202a, 204a, 206a does not require a mask layer. Based on a loading effect between the cell region 200 and the periphery region 300, an etching process can be directly performed to achieve a height difference between the dielectric layers of the cell region 200 and the periphery region 300. Therefore, after the metal layer is formed, contact areas between the first control gate 112b, the fourth control gate 132b and the metal layer are accordingly increased. After the metal silicification process is performed, since the thickness of the first metal silicide layer 116 and the thickness of the fourth metal silicide layer 136 are increased, the resistance of the first metal silicide layer 116 and the resistance of the fourth metal silicide layer 136 can be decreased to improve device reliability.

Moreover, in the present embodiment, although the second stack structure 410c of the high-voltage device region 400 is regarded as the N-type MOS, and the third stack structure 510c of the low-voltage device region 500 is regarded as the P-type MOS, the invention is not limited thereto. In other embodiments, the second stack structure 410c of the high-voltage device region 400 can also be regarded as the P-type MOS, and the third stack structure 510c of the low-voltage device region 500 can also be regarded as the N-type MOS.

In an embodiment, the semiconductor memory device formed according to the above method can be a flash memory, for example, a NOR flash memory, a NAND flash memory, etc. The semiconductor memory device of the present embodiment may combine advantages of a triple gate dielectric layer process and a dual work function gate process to improve the performance of the semiconductor memory device. For example, in the present embodiment, the thickness of the third gate dielectric layer 502 of the third stack structure 510c (i.e. the P-type low-voltage semiconductor device) of the low-voltage device region 500 can be adjusted to decrease a threshold voltage of the P-type low-voltage semiconductor device. On the other hand, under a certain threshold voltage, an operation speed of the P-type low-voltage semiconductor device can be increased. Therefore, the designer may adjust threshold voltages and operation speeds of different devices according to an actual requirement, so as to improve the whole performance of the semiconductor memory device.

In summary, the invention provides a method for manufacturing a semiconductor memory device, which adopts the triple gate dielectric layer process and the dual work function gate process to integrate elements of the cell region and the periphery region on a single chip. During the period of performing the ion implantation process, since the gate structure of the cell region is separated from the gate structures of the high-voltage device region and the low-voltage device region of the periphery region, the phenomenon of neutralization of the N/P-type dopants caused by the subsequent thermal process can be avoided. In this way, the semiconductor memory device of the invention combines the triple gate dielectric layer and the dual work function gate, by which not only the performance of the semiconductor memory device is improved, but also configuration of the semiconductor memory device is more flexible, so as to cope with the demand of the designer or user.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for manufacturing a semiconductor memory device, comprising:

providing a substrate, wherein the substrate has a first region, a second region and a third region;

forming a first stack structure on the first region, wherein the first stack structure sequentially comprises a first gate dielectric layer, a first floating gate, a first inter-gate dielectric layer and a first control gate;

forming a second stack structure on the second region, wherein the second stack structure sequentially comprises a second gate dielectric layer, a second floating gate, a second inter-gate dielectric layer and a second control gate;

forming a third stack structure on the third region, wherein the third stack structure sequentially comprises a third gate dielectric layer, a third floating gate, a third inter-gate dielectric layer and a third control gate;

forming a dielectric layer on the substrate, wherein the dielectric layer covers a top surface of the substrate and exposes top surfaces of the first control gate, the second control gate, and the third control gate;

forming a first mask layer on the dielectric layer and the top surface of the third control gate;

performing a first ion implantation process by using the dielectric layer and the first mask layer as a mask, so that conductive types of the first control gate, the second floating gate, and the second control gate are changed to a first conductive type via the same ion implantation process;

removing the first mask layer, and forming a second mask layer on the dielectric layer and the top surfaces of the first control gate and the second control gate; and performing a second ion implantation process by using the dielectric layer and the second mask layer as a mask, so that conductive types of the third floating gate and the third control gate are changed to a second conductive type.

2. The method for manufacturing the semiconductor memory device as claimed in claim 1, wherein before the first ion implantation process and the second ion implantation process are performed, the method further comprises:

forming a first source/drain in the substrate at two sides of the first stack structure, forming a second source/drain in the substrate at two sides of the second stack structure and forming a third source/drain in the substrate at two sides of the third stack structure.

3. The method for manufacturing the semiconductor memory device as claimed in claim 1, wherein after the second ion implantation process is performed, the method further comprises:

removing the second mask layer;

forming a metal layer on the substrate to cover surfaces of the first control gate, the second control gate and the third control gate; and performing a metal silicification process to form a first metal silicide layer on the first control gate, to form a second metal silicide layer on the second control gate and to form a third metal silicide layer on the third control gate.

4. The method for manufacturing the semiconductor memory device as claimed in claim 1, wherein thicknesses of the first gate dielectric layer, the second gate dielectric layer and the third gate dielectric layer are different to each other.

5. The method for manufacturing the semiconductor memory device as claimed in claim 1, wherein the thickness of the second gate dielectric layer is greater than the thickness of the first gate dielectric layer, and the thickness of the first gate dielectric layer is greater than the thickness of the third gate dielectric layer.

6. The method for manufacturing the semiconductor memory device as claimed in claim 5, wherein the first region is a cell region, the second region is a high-voltage device region, and the third region is a low-voltage device region.

7. The method for manufacturing the semiconductor memory device as claimed in claim 1, wherein the first control gate and the second control gate have the same doping concentration.

8. The method for manufacturing the semiconductor memory device as claimed in claim 1, wherein the first conductive type is different from the second conductive type.

9. The method for manufacturing the semiconductor memory device as claimed in claim 1, wherein the first stack structure, the second stack structure and the third stack structure are separated from each other and not connected to each other.

10. The method for manufacturing the semiconductor memory device as claimed in claim 1, wherein the semiconductor memory device is a flash memory.

* * * * *